United States Patent [19]

Cutchaw

[11] Patent Number: 4,531,146
[45] Date of Patent: Jul. 23, 1985

[54] APPARATUS FOR COOLING HIGH-DENSITY INTEGRATED CIRCUIT PACKAGES

[76] Inventor: John M. Cutchaw, 7333 E. Virginia Ave., Scottsdale, Ariz. 85257

[21] Appl. No.: 513,618

[22] Filed: Jul. 14, 1983

[51] Int. Cl.³ ............................................. H01L 23/46
[52] U.S. Cl. ....................................... 357/82; 357/81; 361/385
[58] Field of Search ......... 165/46, 80 C, 185, DIG. 5; 174/16 HS; 361/382, 385, 386; 357/81, 82; 339/112 L, 112 R

[56] References Cited

U.S. PATENT DOCUMENTS 3,648,121  3/1972  Suenaga et al. .................... 357/75
4,109,707  8/1978  Wilson et al. ...................... 357/82

FOREIGN PATENT DOCUMENTS 0206055  12/1982  Japan ............................... 357/82
0211258  12/1982  Japan ............................... 357/82

OTHER PUBLICATIONS

McGregor, J. E., *Component Support and Cooling*, IBM Tech. Disc. Bull., vol. 2, No. 5, p. 18, 2/1960.

Ronkese, B. J., *Metal Wool and Indium Heat Sink*, IBM Tech. Disc. Bull., vol. 21, No. 3, p. 1143, 8/1978.

*Primary Examiner*—James W. Davie
*Assistant Examiner*—V. Economou
*Attorney, Agent, or Firm*—Herbert E. Haynes, Jr.

[57] ABSTRACT

An apparatus for cooling a high-density integrated circuit package including a base in which the circuit package is mounted and a heat exchanger which mounts on the base to enclose the circuit package and carry away the heat generated by operation thereof by means of a fluid coolant which is passed through the heat exchanger. The heat exchanger includes a housing having a coolant chamber one surface of which is formed of a pliable thinwall diaphragm of thermally conductive material. The coolant chamber is filled with a plurality of thermally conductive spheroids which are biased into thermally conductive contact with each other and with the diaphragm by a resilient elastomeric pressure pad which is mounted in the coolant chamber. The biasing force exerted by the spheroids on the diaphragm biases it into thermally conductive contact with the circuit package so that heat is conducted away from the circuit package by the diaphragm and the spheroids.

12 Claims, 4 Drawing Figures

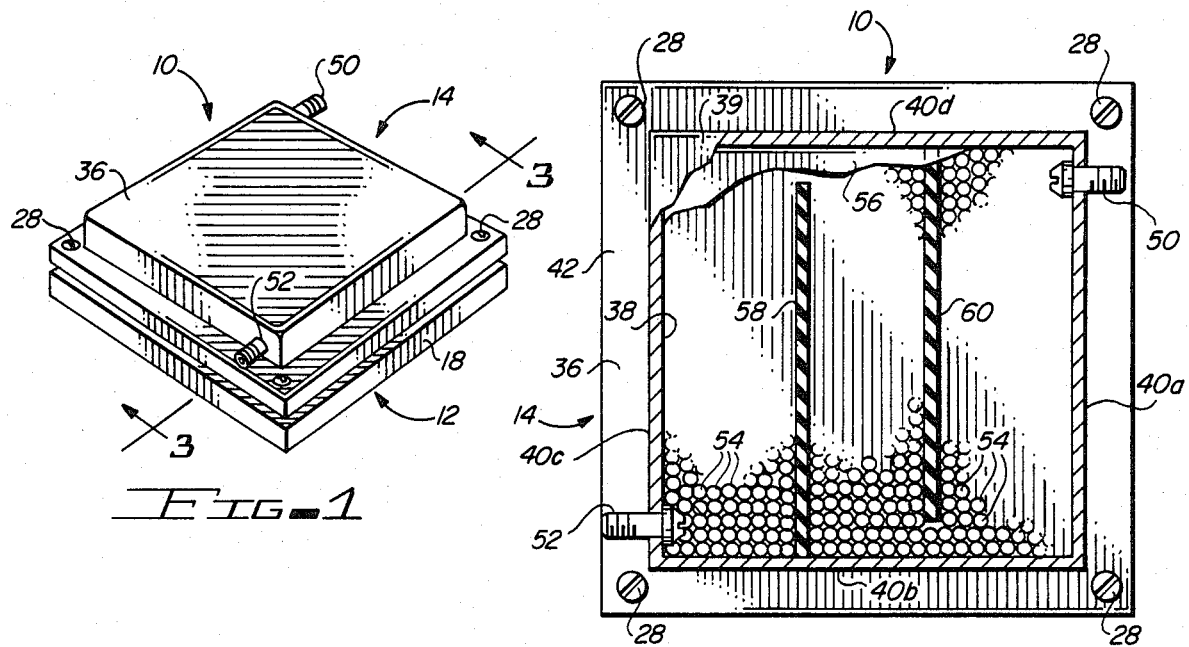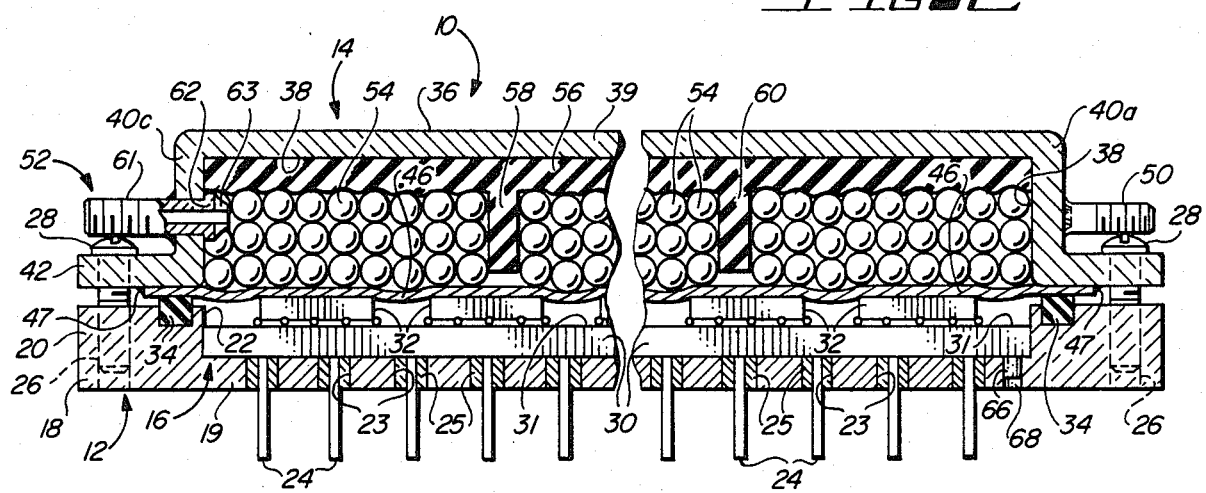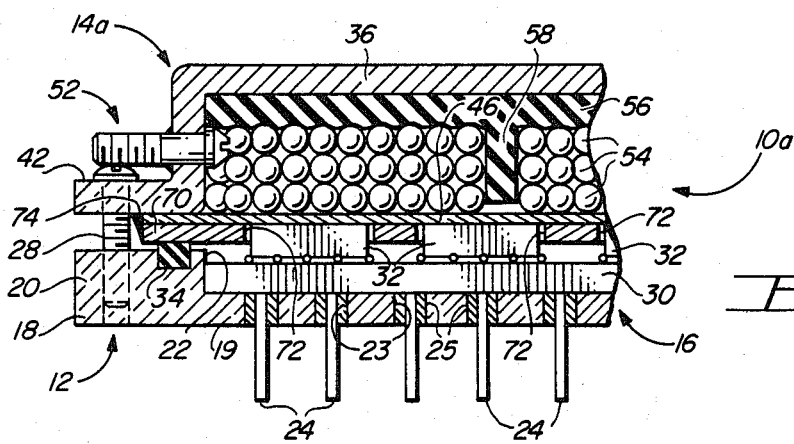

4,531,146

APPARATUS FOR COOLING HIGH-DENSITY INTEGRATED CIRCUIT PACKAGES

BACKGROUND OF THE INVENTION

1. Field of the Invention

This invention relates to cooling mechanisms and more particularly to an apparatus for cooling high-density integrated circuit packages.

2. Description of the Prior Art

In the electronics industry in general, and in the computer arts in particular, one design objective for some time now has been aimed at increasing operational speeds and decreasing unit sizes. One of the major factors which contributed significantly to this design objective is, of course, the integrated circuit chip, or dice as it is sometimes referred to in the industry. Initially, a single disc was mounted in a suitable package, such as a dual-in-line package, and such packages are in common use. However, the trend today is for mounting a plurality of dice in a single package to increase operating speeds by reducing the distances that signals must travel, and also reduce the spaces occupied by the individual dice packaging technique.

Significant gains were made when plural dice were mounted on a two-sided substrate and encapsulated in what is known as a JEDEC package. In those packages, electrical connections between the plural dice are made within the encapsulating package, and electric contacts are provided about the package periphery for connection with other components of the overall system. The limiting factor of these JEDEC packaging arrangements is the space available on the opposite sides of the substrate for connecting the dice together.

The most recent development in this field is the use of a multi-layer substrate which significantly increases the space availble for internal connections. In particular, one package developed by I.B.M. Corporation has successfully mounted 133 dice on a multi-layer ceramic substrate having 33 layers. This package is 90 MM square and has an array of 361 pins depending from the bottom surface of the multi-layer substrate. The pins are soldered into a circuit board which electrically connects the individual pins to the proper components of the overall system.

While this new dice packaging has achieved the desired increased operating speeds, and reduced the overall size, the ultra-high packaging density has created problems relating to heat dissipation. Cooling by radiation into the atmosphere is completely out of the question, and the use of blowers for moving relative high velocity air across the packages is inadequate, and liquid cooling system are being used.

Many of the earlier developed liquid cooling systems, some were developed for use with the JEDEC packages, are inadequate for use with the newly developed multi-layer packaging technology due to insufficient heat transfer between the plural dice and the liquid coolant, and their inability to carry away a sufficient amount of the heat generated by the large number of dice.

The cooling system developed by the I.B.M. Corporation for use with the hereinbefore described multilayer packages, includes intricate metal castings, one of which contains the package in a helium filled environment and is provided with 133 bores, each containing a spring-loaded piston. Each of these pistons is in contact with a different one of the dice to carry heat away from the dice through the piston, spring, and metal of the casting. Another metal casting is carried atop the piston casting to provide a chilled coolant chamber, which absorbs heat from the lower casting. This cooling apparatus is an exceptionally complex and costly mechanism, occupies a considerable amount of space, and its thermal transfer efficiency is questionable due to the plural heat conductors and interfacing gaps which are encountered by heat migrating from the dice through the pistons, through the springs, through the metal top wall of the lower casting, through the metal lower wall of the top casting and ultimately to the circulating coolant.

Another prior art structure which is disclosed in my U.S. Pat. No. 4,381,032, includes a base in which the high-density circuit package is nestingly mounted. A heat exchanger is mounted on the base so as to sealingly enclose the circuit package. The heat exchanger includes a rigid housing having a downwardly opening coolant chamber which is enclosed by a thin-wall metallic diaphragm that rests in thermally conductive contiguous contact with each of the dice of the integrated circuit package. A liquid coolant is circulatingly moved through the coolant chamber which biases the diaphragm into conductive contact with the dice in addition to its carrying away the heat generated by operation of the integrated circuit package. To insure a more positive contact between the diaphragm and the dice, additional biasing forces are applied to the diaphragm by elastomeric elements, or spring-loaded pistons, provided in the coolant chamber, and these elastomeric elements, or spring-loaded pistons, apply their biasing forces to localized areas of the diaphragm with those areas being those which are in contact with the dice of the circuit package. Although this prior art structure is quite efficient, its ability to carry away the operational heat of the operating integrated circuit package is limited by the heat transfer capabilities of the thin-wall diaphragm and the ability of the circulating coolant to absorb the heat transferred thereto by the diaphragm.

Therefore, a need exists for a new and improved apparatus for cooling high-density integrated circuit packages which overcomes some of the problems and shortcomings of the prior art.

SUMMARY OF THE INVENTION

In accordance with the present invention, a new and improved apparatus for cooling high-density integrated circuit packages is disclosed as including a base means for nestingly containing a high-density integrated circuit package which is sealingly enclosed therein by an especially configured heat exchanger, which is demountably carried on the base means.

The heat exchanger includes a rigid metallic housing having a downwardly opening coolant chamber formed therein, which is sized to approximately match that of the high-density integrated circuit package. The downwardly opening coolant chamber is sealingly enclosed by a thin-wall pliant thermally conductive diaphragm or membrane. The pliant thermally conductive membrane rests in thermally conductive contiguous engagement with each of the dice of the high-density integrated circuit package mounted therebelow in the base means. In addition to the pliant membrane resting on the dice, the heat exchanger exerts two additional types of mechanical forces on the membrane to positively bias it into pressurized thermally conductive contact with the dice. The first of these additional mchanical forces may be referred to as hydraulic in that the liquid coolant, which is circulatingly passed through the chamber of the heat exchanger under pressure, will biasingly load the thermally conductive diaphragm into contact with the dice. The second mechanical force is provided by a plurality of thermally conductive spheriods, or balls, which are contained and substantially fill the coolant chamber of the heat exchanger housing. The spheroids, which are preferably made of metal, are loaded into biasing engagement with the thermally conductive diaphragm by means of a resilient elastomeric pressure pad which is compressively interposed between the top wall, or roof, of the heat exchanger housing and the upper layer of the spheroids. Since there is a multiplicity of the spheroids, physical contact of the spheroids with the diaphragm will be made at multiple points over virtually the entire inwardly facing surface of the diaphragm.

In addition to the advantage of the evenly distributed biasing force, the most important advantage of employing the plurality of metallic spheroids is the increased thermal conductivity, or heat exchange, capabilities provided thereby.

As is well known, the thermal conductivity of metal is far superior to that of liquids. Therefore, the heat conducted through the thermally conductive diaphragm is readily conducted to the metal spheroids at each point where the spheroids are in engagement with the diaphragm, and the heat is similarly transferred, or conducted, to each spheroid of the multiple spheroids contained in the coolant chamber in that each spheroid is in engagement with the several spheroids adjacent thereto. This, in effect, results in a substantial increase in the heat exchange surface area which transfers heat by radiation, convection, and conduction to the liquid coolant that is passed through the coolant chamber of the heat exchanger. The magnitude of the increase in the heat exchange surface area will be appreciated upon consideration of the structure disclosed in my hereinbefore referenced prior art patent. In the first disclosed embodiment of that patent, the total heat exchange surface area is that of the inwardly facing surface of the pliant diaphragm less the points of engagement with the elastomeric biasing elements. In the second embodiment, the total heat exchange surface area was enhanced a bit by the biasing piston. In the apparatus of the present invention, the total heat exchange surface area is the sum of the inner surface of the diaphragm (less the area of the contact points of the spheroids) plus the surface areas of each of the spheroids (less the points where the spheroids touch each other and touch the elastomeric pressure pad and the sidewalls of the heat exchanger housing).

Other advantages of employing the plurality of metallic spheroids in the coolant chamber of the heat exchanger are that they present a tortuous flow path to prevent channelization, and the like, of the coolant which flows therethrough under pressure between the inlet and outlet ports thereof. It should be noted that the coolant is supplied from a suitable remote source or system which forms no part of the present invention. The other advantage of the multiple spheroids is that they prevent gaseous bubbles, which may result from coolant boiling, cavitation, or the like, from forming relatively large voids or pockets in cooling chamber.

Accordingly, it is an object of the present invention to provide a new and improved apparatus for cooling high-density integrated circuit packages.

Another object of the present invention is to provide a new and improved apparatus for cooling high-density integrated circuit packages which is of minimum complexity, cost and size.

Another object of the present invention is to provide a new and improved apparatus for cooling high-density integrated circuit packages and having improved heat transfer efficiency.

Another object of the present invention is to provide a new and improved apparatus for cooling high-density integrated circuit packages which includes an especially configured heat exchanger which sealingly encloses a high-density integrated circuit package within a base means and carries heat away from the package by means of a coolant which is passed through the heat exchanger.

Another object of the present invention is to provide an apparatus of the above described character wherein the heat exchanger includes a housing having a downwardly opening coolant chamber which is sealingly closed by a thin-wall pliant thermally conductive membrane that is in thermally conductive contact with the circulating coolant and with the individual dice of the integrated circuit package.

Another object of the present invention is to provide an apparatus of the above described character wherein the pliant thermally conductive membrane rests on each of the dice of the high-density integrated circuit package and is biasingly urged into positive thermally conductive contiguous engagement with the dice by hydraulic forces derived from the coolant which passes through the heat exchanger and from a plurality of spheroids which are contained within the coolant chamber of the heat exchanger and apply an evenly distributed biasing force on the membrane as a result of a resilient elastomeric pressure pad which is also contained in the coolant chamber.

Another object of the present invention is to provide an apparatus of the above described type wherein the plurality of spheroids are of a material having a high thermal conductivity so that the heat conducted away from the integrated circuit package by the pliant membrane will be conductively absorbed by the spheroids to increase the effective heat exchange surface area which is in contact with the liquid coolant for improved heat transfer purposes.

Still another object of the present invention is to provide an apparatus of the above described character wherein the multiple spheroids in the coolant chamber of the heat exchanger present a tortuous coolant flow path and prevent the formation of large gaseous voids or pockets within the coolant chamber.

The foregoing and other objects of the present invention, as well as the invention itself, may be more fully understood from the following description when read in conjunction with the accompanying drawings.

BRIEF DESCRIPTION OF THE DRAWINGS

FIG. 1 is a perspective view of the apparatus of the present invention.

FIG. 2 is an enlarged plan view of the apparatus which is partially broken away to show the various features thereof.

FIG. 3 is an enlarged fragmentary sectional view taken along the line 3—3 of FIG. 1.

FIG. 4 is a fragmentary sectional view similar to FIG. 3 and showing a modification of the apparatus of the present invention.

DESCRIPTION OF THE PREFERRED EMBODIMENTS

Referring more particularly to the drawings, wherein the apparatus for cooling high-density integrated circuit packages is identified in its entirety by the reference numeral 10. As will hereinafter be described in detail, the apparatus 10 includes two basic elements, namely a base means 12 and a heat exchanger 14, which sealingly enclose a high-density integrated circuit package 16 an carry away the heat generated by operation of the circuit package.

The base means 12 is seen to be a substantially planar housing 18 having a floor 19 with an endless upstanding sidewall 20 which defines an upwardly opening chamber 22 for nestingly receiving the circuit package 16. The floor 19 is provided with a plurality of apertures 23 which are arranged in a geometric array which matches the array of conductive pins 24 which depend from the circuit package 16, so that each of the pins 24 passes through a different one of the apertures 23 so as to extend beyond the floor 19 of the base means. A suitable seal 25, such as of glass, is provided in the apertures so that the base means will be a hermetically sealed structure for reasons which will become apparent as this description progresses.

The base means 12 also is provided with an internally threaded bore 26 at each of its four corners for containing fastener means 28 by which the heat exchanger 14 is demountably mounted on the base means 12.

The high-density integrated circuit package 16 forms no part of the apparatus of the present invention, but is shown and will now be briefly described for completeness of this disclosure. The package 16 includes a multi-layer substrate 30, usually of ceramic, and the hereinbefore mentioned multiplicity of pins 24 extend from one planar surface of the substrate. The pins 24 provide means for making the necessary electrical interconnections between the integrated circuit package 16 and the other components of the system (not shown) in which the package is to be used. Further, in accordance with customary practices, the pins 24 are also used to mount the package on a circuit board (not shown) by soldering the pins in holes provided on the circuit board. The opposite planar surface 31 of the multi-layer substrate 30 has a plurality of discrete integraged circuits 32, or dice, mounted thereon in a predetermined geometric array which usually consists of a plurality of equally spaced rows and columns.

As seen in FIG. 3, the upwardly opening chamber 22 of the base means 12 is deeper than the thickness dimension of the substrate 30 and an endless elastomeric seal 34 of square sided ring-like shape is contained in an endless groove formed in the upwardly facing surface of the sidewall 20. The seal 34 extends above the upwardly facing surface of the endless sidewall 20 of the base means 12, and is used to sealingly encase the integrated circuit package 16 in the apparatus 10 as will hereinafter be described in detail.

The heat exchanger 14 includes a housing 36 of relatively thick wall material, preferably metal, which is configured to define a downwardly opening chamber 38 which will hereinafter be referred to as the coolant chamber for reasons which will soon become apparent. The housing 36 includes a roof wall 39 with an integrally depending endless sidewall formed of sidewall segments 40a, 40b, 40c and 40d, which cooperatively define the coolant chamber 38. An endless flange 42 extends normally from the sidewall and suitable apertures are provided at each corner thereof for receiving the fastener means 28 by which the heat exchanger 14 is demountably attached to the base means 12.

The coolant chamber 38 of the heat exchanger 14 is sealingly closed by a pliable thin-wall diaphragm 46, or membrane, which is preferably formed of a metal having good heat transfer properties, such as copper. The peripheral edge of the diaphragm 46 partially overlays the endless flange 42 of the housing 36 and is fixedly attached thereto such as by soldering, welding, or the like, as indicated at 47 in FIG. 3.

As hereinbefore mentioned, the integrated circuit package 16 is provided with the plurality of discrete dice 32 arranged in a predetermined geometric array thereon. The pliant thin-wall thermally conductive diaphragm 46 is biased, as will hereinafter be described in detail, into thermally conductive contact with those dice to carry away the heat generated thereby.

The coolant chamber 38 of the heat exchanger 14 is provided with a fluid coolant inlet fitting 50 in the sidewall segment 40a of the housing 36, and a fluid coolant outlet fitting 52 is mounted in the opposite sidewall segment 40c. A fluid coolant (not shown) is passed through the coolant chamber 38 under pressure with the coolant being supplied by a suitable remote system (not shown) which forms no part of the present invention. For reasons which will hereinafter be described in detail, the coolant fittings are of special configuration.

From the above it will be seen that to achieve good heat transfer characteristics in the apparatus 10, the membrane 46 must be in contiguous contact with the dice 32, and this is achieved by biasing the membrane 46 into possitive thermally conductive contact with the dice. As mentioned above, the biasing is achieved, in part, by hydraulic forces exerted by the liquid coolant which is passed through the coolant chamber under pressure. The hydraulic biasing is enhanced by a plurality of spheroids 54 and a resilient elastomeric pressure pad 56 which are both contained within the coolant chamber 38 of the heat exchanger 14. The spheroids are formed of a material having good thermal conduction properties, such as metal, for reasons which will hereinafter be described, and are seen to substantially fill the coolant chamber. The pressure pad 56 is compressingly interposed between the inwardly facing surface of the roof wall 39 and the upper layer of the spheroids 54. In this manner, the pressure pad 56 will biasingly urge the spheroids 54 toward the membrane 46 and thus bias it in the same direction as the hydraulically applied biasing force.

The biasing force applied to the spheroids 54 by the pressure pad 56 will positively hold the spheroids in thermally conductive contact with the inner surface of the membrane and in contact with each other. In this manner, the heat conducted away from the high-density integrated circuit package 16 by the pliant diaphragm 46 will be transferred by conductance into each of the spheroids 54, and this significantly improves the heat exchanging capabilities of the apparatus 10 by providing a maximum heat exchange surface area into which the liquid coolant comes in contact.

In addition to applying an evenly distributed biasing force on the membrane 46 and providing maximum heat exchange surface area, the spheroids provide other advantages.

The first additional advantage provided by the multiplicity of spheroids is that they provide a tortuous flow path for the coolant which passes through the heat exchanger 14 to prevent localized hotspots which could otherwise occur as a result of channelization, and the like. To insure that chanelization, and the like, does not occur, the resilient elastomeric pressure pad 56 may be provided with depending partitions 58 and 60, which integrally depend from the pad and have their depending edges proximate but spaced upwardly from the pliant diaphragm 46 as seen best in FIG. 3. FIG. 2 shows the partition 60 as having one of its ends in abutting engagement with the sidewall segment 40d of the heat exchanger housing 36 and having its opposite end spaced from the sidewall segment 40b to provide a flow directing path, or channel around that partition 60. The other partition 58 is seen to have one of its ends in abutting engagement with the sidewall segment 40b and having its other end spaced from the sidewall segment 40d to provide an opposite flow path or channel around that partition. Thus, the total effect of the depending partitions 58 and 60 will be to direct or guide the coolant flow in a sinusoidal path through the coolant chamber.

Another advantage provided by the multiple spheroids is that they will prevent the formation of gaseous voids or pockets which could otherwise form in the coolant chamber 38 of the heat exchanger. If any steam bubbles form in the coolant as a result of boiling, the bubbles will be quickly condensed back into liquid form by contact with the relatively cooler spheroids. Any minute air bubbles resulting from, for example, cavitation, will be prevented from collecting to form a relatively large void or pocket, by the multiple spheroids which constantly contact and change the movement path of any minute bubbles thus preventing them from collecting.

The resilient elastomeric pressure pad 56 is preferably made of a high-temperature resilient elastomeric material, such as silicone, and may be impregnated during fabrication with a metallic particle filler so that heat may be transferred therethrough to the heat exchanger housing 36 thus allowing it to act as a heat sink.

The hereinbefore mentioned special configuration of the coolant inlet and outlet fittings 50 and 52 is seen best in FIG. 3 wherein the typical fitting 52 is shown in partial section. As seen, the fitting 52, and thus the fitting 50, have tubular bodies or shanks 61, with external threads being provided on the outwardly extending ends. The inner end of each of the fittings is provided with an enlarged head 62 having radial slots 63. This special head configuration is advantageous so that the flow of coolant cannot be restricted, or completely blocked, by one of the spheroids moving into or being in a position where it would block the axial mouth of the bore of the fitting shank.

When the heat exchanger 14 is mounted on the base means 12, the integrated circuit package 16 is sealingly enclosed in the chamber 22 of the base means 12, as hereinbefore mentioned. To improve the overall heat transfer capabilities of the appartus 10, the chamber 22 may have the air in the sealed chamber 22 extracted therefrom and replaced with a high thermally conductive gas, such as helium. This may be accomplished, for example, by, as shown in FIG. 3, providing a suitable port 66 in the floor 19 of the base means 16 and inserting a plug 68 therein after the chamber 22 has been filled with the thermally conductive gas.

As is well known, and as hereinbefore described, the dice 32 of the high-density integrated circuit package 16 are arranged in a predetermined array on the substrate 30. In such arrangements, the dice will, of course, be spaced with regard to each other, and such spacing is determined by the density of the particular package. In high-density packages, the spacing between the dice will be relatively small and this will not cause any problems with regard to the unsupported areas of the thin-wall pliant diaphragm 46. As indicated in FIG. 3, the diaphragm 46 is biased into contiguous contact with the upper surface of each of the dice 32, and the diaphragm may be distended, or bulged, downwardly in the spaces between the dice.

To prevent excessive distension of the pliant membrane 46, which could occur in the spaces, or areas, between the dice in relatively low-density circuit packages, the apparatus of the present invention may be modified with the modified apparatus being indicated generally by the reference numeral 10a in FIG. 4. In order to prevent repeating of structural details which have already been described in detail, it will be understood that the apparatus 10a is identical to the hereinbefore described apparatus 10, with the exception of those portions which will now be described in detail.

The heat exchanger 14a of this embodiment includes a substantially rigid support plate 70 which is provided with a plurality of apertures 72 that are arranged in a geometric array which matches the array of the dice 32 of the circuit package 16. The apertured support plate 70 is disposed in coextensive supporting engagement with the downwardly facing surface of the pliant membrane 46 and is configured to expose those areas of the membrane which are in thermally conductive contact with the dice and support those areas thereof which lie in the areas, or spaces, between the dice.

The support plate 70 may be formed of metal with a suitable dielectric surface coating (not shown) and having bare metal peripheral edges to allow the plate to be fixedly attached, along with the membrane 46, to the endless flange 42 of the heat exchanger housing 36, such as by soldering, welding, or the like, about the peripheries of the membrane and the support plate as indicated at 74.

It will be understood that the above described metallic character and fixed attachment of the support plate 70 is not absolutely necessary in that the same end result could be accomplished by using a rigid plastic plate and by providing a suitable seal (not shown) between the membrane 46 and the support plate, and simply locating the support plate in the desired interposed position between the heat exchanger housing 36 and the planar housing 18 of the base means 12.

While the principles of the invention have now been made clear in illustrated embodiments, there will be immediately obvious to those skilled in the art, many modifications of structure, arrangements, proportions, the elements, materials, and components used in the practice of the invention, and otherwise, which are particularly adapted for specific environments and operation requirements without departing from those principles. The appended claims are therefore intended to cover and embrace any such modifications within the limits only of the true spirit and scope of the invention.

What I claim is:

1. An apparatus for cooling a high-density integrated circuit package of the type having a substrate with a plurality of discrete integrated circuits arranged thereon in a predetermined array, said apparatus comprising:
   (a) a housing defining an open coolant chamber which is sized so that its opening substantially matches the surface area of the substrate of the integrated circuit package, said housing for positioning in overlying relationship with respect to the integrated circuit package;
   (b) a diaphragm of thin-wall pliable heat conductive material with its peripheral edges fixedly attached to said housing so as to sealingly enclose the coolant chamber thereof, said diaphragm having an outwardly facing surface which is in contiguous engagement with each of the discrete integrated circuits of the integrated circuit package when said housing is in overlaying relationship therewith;
   (c) said housing having an inlet port and an outlet port by which fluid coolant is passable through the coolant chamber of said housing;
   (d) a plurality of spheroids in the coolant chamber of said housing for substantially filling the coolant chamber, each of said spheroids being formed of a metal for conducting heat away from said diaphragm and maximizing the heat exchange surface area into which the fluid coolant comes in contact when passes through the coolant chamber of said housing; and
   (e) biasing means in the coolant chamber of said housing and disposed between said housing and said plurality of spheroids for biasing said spheroids into contact with each other and with said diaphragm.

2. An apparatus as claimed in claim 1 wherein said biasing means is a resilient elastomeric pressure pad which is compressingly interposed between said housing and said plurality of spheroids.

3. An apparatus as claimed in claim 2 wherein said resilient elastomeric pressure pad is provided with at least a spaced pair of partitions which depend therefrom into spaced proximity with said diaphragm.

4. An apparatus as claimed in claim 2 wherein said resilient elastomeric pressure pad is formed with a metallic particle filler for heat conduction purposes.

5. An apparatus as claimed in claim 1 wherein said housing comprises:
   (a) a roof wall of substantially planar configuration; and
   (b) an endless sidewall extending normally from the periphery of said roof wall.

6. An apparatus as claimed in claim 1 and further comprising:
   (a) base means defining an open chamber for nestingly receiving the integrated circuit package; and
   (b) cooperative elements of a demountable connection on said base means and on said housing for attaching said housing to said base means in overlaying relationship with the integrated circuit package when it is nestingly received in said base means.

7. An apparatus as claimed in claim 6 and further comprising:
   (a) said open chamber of said base means being deeper than the thickness dimension of the substrate of the integrated circuit package; and
   (b) an endless ring-shaped elastomeric seal mounted on said base means so as to surround the open chamber thereof and configured to extend upwardly from said base means for sealingly engaging said housing.

8. An apparatus as claimed in claim 1 and further comprising support plate means in engagement with the outwardly facing surface of said diaphragm and having aperture means for exposing the areas of said diaphragm which are in engagement with the discrete integrated circuits of the integrated circuit packge when said housing is in overlaying relationship therewith and supporting the other areas of said diaphragm.

9. An apparatus as claimed in claim 1 and further comprising a support plate in supporting coextensive engagement with the outwardly facing surface of said diaphragm, said support plate having a plurality of apertures formed therethrough and arranged in a geometric array which matches the array of discrete integrated circuits of the high-density integrated circuit package over which said housing is positionable in overlaying relationship.

10. An apparatus as claimed in claim 9 wherein said support plate is fixedly attached to said housing.

11. An apparatus for cooling a high-density integrated circuit package of the type having a substrate with a plurality of discrete integrated circuits arranged thereon in a predetermined geometric array, said apparatus comprising:
   (a) a housing defining an open coolant chamber which is sized so that its opening substantially matches the surface area of the substrate of the integrated circuit package, said housing for positioning in overlaying relationship with respect to the integrated circuit package;
   (b) a diaphragm of thin-wall pliable heat conductive material with its peripheral edges fixedly attached to said housing so as to sealingly enclose the coolant chamber thereof, said diaphragm being in contiguous engagement with each of the discrete integrated circuits of the integrated circuit package when said housing is in overlaying relationship therewith;
   (c) said housing having an inlet and an outlet by which fluid coolant is passable through the coolant chamber of said housing;
   (d) a plurality of metal spheroids in the coolant chamber of said housing and substantially filling the coolant chamber;
   (e) a resilient elastomeric pressure pad in the coolant chamber of said housing and being compressively interposed between said housing and said plurality of spheroids to bias said plurality into thermally conductive contact with each other and with said diaphragm and to bias said diaphragm into thermally conductive contact with the discrete integrated circuits of the integrated circuit package when said housing is in overlaying relationship therewith;
   (f) base means defining an open chamber for nestingly receiving the integrated circuit package; and
   (g) cooperative elements of a demountable connection on said housing and said base means for attaching said housing to said base means in overlaying relationship with the integrated circuit package when it is nestingly received in said base means.

12. An apparatus as claimed in claim 11 and further comprising a support plate means interposed between said housing and said base means, said support plate having an array of apertures formed therethrough for exposing the areas of said diaphragm which are for engagement with the discrete integrated circuits of the integrated circuit package and supporting the other areas of said diaphragm.

* * * * *